US012775377B2

(12) United States Patent
Davis et al.

(10) Patent No.: US 12,775,377 B2
(45) Date of Patent: Oct. 27, 2026

(54) REDUCING STORAGE SYSTEM LATENCY USING INTERRUPTIBLE STORAGE OPERATIONS

(71) Applicant: PURE STORAGE, INC., Santa Clara, CA (US)

(72) Inventors: John D. Davis, San Francisco, CA (US); John Hayes, Mountain View, CA (US); Hari Kannan, Sunnyvale, CA (US); Nenad Miladinovic, Los Gatos, CA (US); Zhangxi Tan, Mountain View, CA (US)

(73) Assignee: EVERPURE, INC., Santa Clara, CA (US)

( * ) Notice: Subject to any disclaimer, the term of this patent is extended or adjusted under 35 U.S.C. 154(b) by 58 days.

(21) Appl. No.: 18/932,538

(22) Filed: Oct. 30, 2024

(65) Prior Publication Data

US 2025/0053298 A1 Feb. 13, 2025

Related U.S. Application Data

(63) Continuation of application No. 17/897,014, filed on Aug. 26, 2022, now Pat. No. 12,229,402, which is a continuation of application No. 17/213,697, filed on Mar. 26, 2021, now Pat. No. 11,442,625, which is a continuation of application No. 16/278,547, filed on Feb. 18, 2019, now Pat. No. 10,990,283, which is a
(Continued)

(51) Int. Cl.

| | |
|---|---|
| ***G06F 3/06*** | (2006.01) |
| ***G06F 11/10*** | (2006.01) |
| ***G11C 29/52*** | (2006.01) |
| ***H03M 13/11*** | (2006.01) |
| ***H03M 13/15*** | (2006.01) |
| ***H03M 13/37*** | (2006.01) |

(52) U.S. Cl.
CPC .......... *G06F 3/0604* (2013.01); *G06F 3/0619* (2013.01); *G06F 3/064* (2013.01); *G06F 3/0659* (2013.01); *G06F 3/067* (2013.01); *G06F 3/0688* (2013.01); *G06F 11/1008* (2013.01); *G06F 11/1068* (2013.01); *G11C 29/52* (2013.01); *H03M 13/154* (2013.01); *H03M 13/373* (2013.01); *H03M 13/1102* (2013.01); *H03M 13/1515* (2013.01); *H03M 13/3761* (2013.01)

(58) Field of Classification Search
None
See application file for complete search history.

(56) References Cited

U.S. PATENT DOCUMENTS 5,280,618 A 1/1994 Takagi
5,375,225 A 12/1994 Dean et al.
(Continued)

OTHER PUBLICATIONS

Frakes Dan, "Up close with Mountain Lion: Power Nap (Frakes, Dan, Working Mac—Up close with Mountain Lion: Power Nap, Macworld.com, "Aug. 1, 2012, pp. 1-6.

*Primary Examiner* — Daniel F. McMahon

(57) ABSTRACT

A request to read data from a storage system is received. One of an interruptible write operation or an interruptible erase operation being performed on flash memory of the storage system are paused by a storage system controller. A read operation for the request to read the data is performed. The one of the interruptible write operation or interruptible erase operation are resumed.

20 Claims, 8 Drawing Sheets

Related U.S. Application Data continuation of application No. 15/285,410, filed on Oct. 4, 2016, now Pat. No. 10,216,411, which is a continuation of application No. 14/454,503, filed on Aug. 7, 2014, now Pat. No. 9,483,346.

(56) References Cited

U.S. PATENT DOCUMENTS 5,854,937 A 12/1998 Woodward
6,546,438 B1 4/2003 Katsetos et al.
7,330,858 B1 * 2/2008 Karr .......................... G06F 3/067
8,370,592 B1 * 2/2013 Specht ................ G06F 11/3055 707/661
8,380,909 B2 2/2013 Borchers et al.
8,452,912 B2 * 5/2013 Lee ..................... G06F 12/0866 714/766
8,572,322 B2 * 10/2013 Xu ...................... G06F 13/1689 711/122
9,910,742 B1 3/2018 Faibish et al.
9,933,950 B2 4/2018 Hyun et al.
12,236,983 B1 2/2025 Zhang et al.
2003/0158994 A1 * 8/2003 Moy ..................... G06F 13/423 710/311
2004/0122986 A1 6/2004 Diamant
2004/0225850 A1 11/2004 Li et al.
2006/0053247 A1 3/2006 Cheung et al.
2007/0217253 A1 9/2007 Kim et al.
2009/0044190 A1 2/2009 Tringali et al.
2009/0216930 A1 8/2009 Nishino
2011/0026318 A1 * 2/2011 Franceschini ....... G06F 13/1642 365/163
2011/0055453 A1 * 3/2011 Bennett .................. G11C 16/26 711/E12.001
2011/0126045 A1 * 5/2011 Bennett .............. G11B 20/1833 714/6.22
2011/0179413 A1 7/2011 Subramanian et al.
2011/0258362 A1 10/2011 McLaren et al.
2012/0047287 A1 * 2/2012 Chiu ..................... G06F 3/0605 710/8
2012/0151127 A1 * 6/2012 Lim .................... G06F 12/1009 711/206
2012/0215740 A1 * 8/2012 Vaillant ................. G06F 16/273 707/634
2013/0117503 A1 * 5/2013 Nellans ............... G06F 12/0246 711/103
2013/0198451 A1 * 8/2013 Hyun .................... G06F 3/0652 711/155
2013/0205085 A1 * 8/2013 Hyun .................... G06F 3/0679 710/5
2014/0095825 A1 * 4/2014 Moon ................. G06F 13/1689 711/169
2016/0012891 A1 * 1/2016 Intrater ............... G06F 13/1668 365/189.011
2016/0142485 A1 5/2016 Mitkar et al.
2017/0155713 A1 6/2017 Powell et al.
2018/0074748 A1 3/2018 Makin et al.
2018/0081562 A1 3/2018 Vasudevan
2018/0210661 A1 7/2018 Hyun et al.
2022/0156114 A1 5/2022 Nagpal et al.
2022/0404970 A1 12/2022 Davis et al.
2023/0393742 A1 12/2023 Karr et al.

* cited by examiner

REDUCING STORAGE SYSTEM LATENCY USING INTERRUPTIBLE STORAGE OPERATIONS

CROSS REFERENCE TO RELATED APPLICATION

This application is a continuation application for patent entitled to a filing date and claiming the benefit of earlier-filed U.S. patent application Ser. No. 17/897,014, filed Aug. 26, 2022, which is a continuation application of U.S. patent application Ser. No. 17/213,697, filed Mar. 26, 2021, issued as U.S. Pat. No. 11,442,625 on Sep. 13, 2022, which is a continuation application of U.S. patent application Ser. No. 16/278,547, filed Feb. 18, 2019, issued as U.S. Pat. No. 10,990,283 on Apr. 27, 2021, which is a continuation application of U.S. patent application Ser. No. 15/285,410, filed Oct. 4, 2016, issued as U.S. Pat. No. 10,216,411 on Feb. 26, 2019, which is a continuation application of U.S. patent application Ser. No. 14/454,503, filed Aug. 7, 2014, issued as U.S. Pat. No. 9,483,346 on Nov. 1, 2016, all of which are hereby incorporated herein by reference in their entirety.

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media, which may lead to scheduling conflicts in solid-state storage. Variations in delays from reading bits in a solid-state storage may make it difficult to guarantee performance. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a storage cluster is provided. The storage cluster includes a plurality of storage nodes, each of the plurality of storage nodes having nonvolatile solid-state memory for storage of user data and each of the plurality of storage nodes having a plurality of operations queues coupled to the non-volatile solid-state memory. The plurality of storage nodes is configured to distribute the user data and metadata associated with the user data throughout the plurality of storage nodes such that the plurality of storage nodes can access the user data, via erasure coding, with a failure of two of the plurality of storage nodes. Each of the plurality of storage nodes is configured to determine whether a read of a bit in the non-volatile solid-state memory via a first path is within a latency budget, based on feedback from the plurality of operations queues. The plurality of storage nodes is configured to perform a read of the user data or the metadata via a second path, responsive to a determination that the read of the bit via the first path is not within the latency budget.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
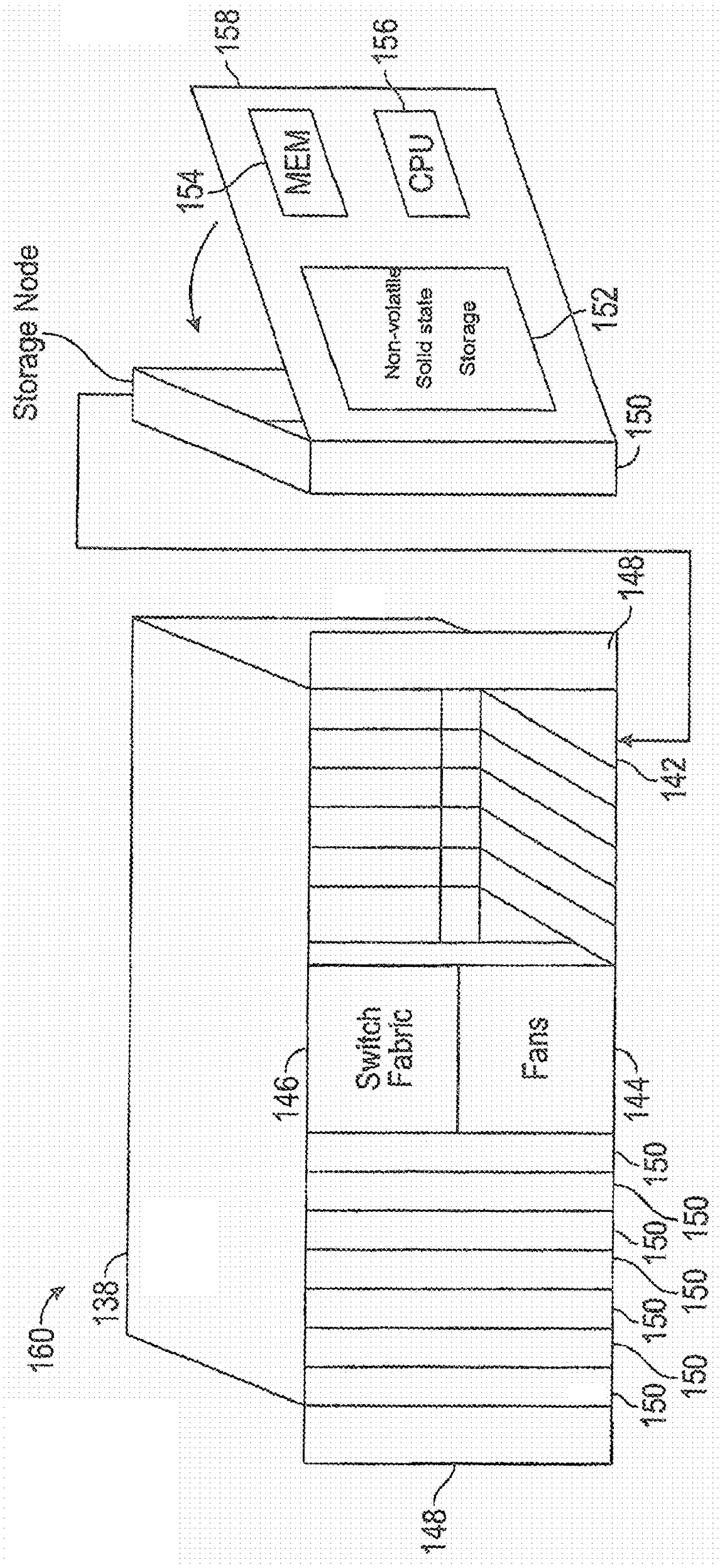
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection in which data is broken into fragments, expanded and encoded with redundant data pieces and stored across a set of different locations, such as disks, storage nodes or geographic locations. Flash memory is one type of solid-state memory that may be integrated with the embodiments, although the embodiments may be extended to other types of solid-state memory or other storage medium, including non-solid-state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid-state memory units, which may be referred to as non-volatile solid-state storage units. One embodiment includes a single storage server in each storage node and between one to eight non-volatile solid-state memory units, however this one example is not meant to be limiting. The storage server may include a processor, dynamic random access memory (DRAM) and interfaces for the internal communication bus and power distribution for each of the power buses. Inside the storage node, the interfaces and non-volatile solid-state storage share a communication bus, e.g., PCI Express, in some embodiments. The non-volatile solid-state memory units may directly access the internal communication bus interface through a storage node communication bus, or request the storage node to access the bus interface. The non-volatile solid-state memory unit contains an embedded central processing unit (CPU), solid-state storage controller, and a quantity of solid-state mass storage, e.g., between 2-32 terabytes (TB) in some embodiments. An embedded volatile storage medium, such as DRAM, and an energy reserve apparatus are included in the non-volatile solid-state memory unit. In some embodiments, the energy reserve apparatus is a capacitor, super-capacitor, or battery that enables transferring a subset of DRAM contents to a stable storage medium in the case of power loss. In some embodiments, the non-volatile solid-state memory unit is constructed with a storage class memory, such as phase change or magnetoresistive random access memory (MRAM) that substitutes for DRAM and enables a reduced power hold-up apparatus.

Various aspects of storage clusters, storage nodes, and non-volatile solid-state storage units are discussed with reference to FIGS. 1-3. Embodiments of a non-volatile solid-state storage with multiple operations queues, scheduling policies, and various paths for reading bits are discussed with reference to FIGS. 4-7. The operations queues provide feedback that is used to evaluate whether a read of a particular bit in a solid-state memory, e.g., flash memory, can be accomplished within a latency or delay budget. When such a read is predicted to be too slow, the storage cluster uses an alternate path, such as reading a redundant copy of a bit, or applying erasure coding to rebuild a data segment.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid-state storage unit 152 coupled to the CPU 156, although other mountings and/or components could be used in further embodiments. The memory 154 has instructions which are executed by the CPU 156 and/or data operated on by the CPU 156. As further explained below, the non-volatile solid-state storage unit 152 includes flash or, in further embodiments, other types of solid-state memory.

Figure 2:
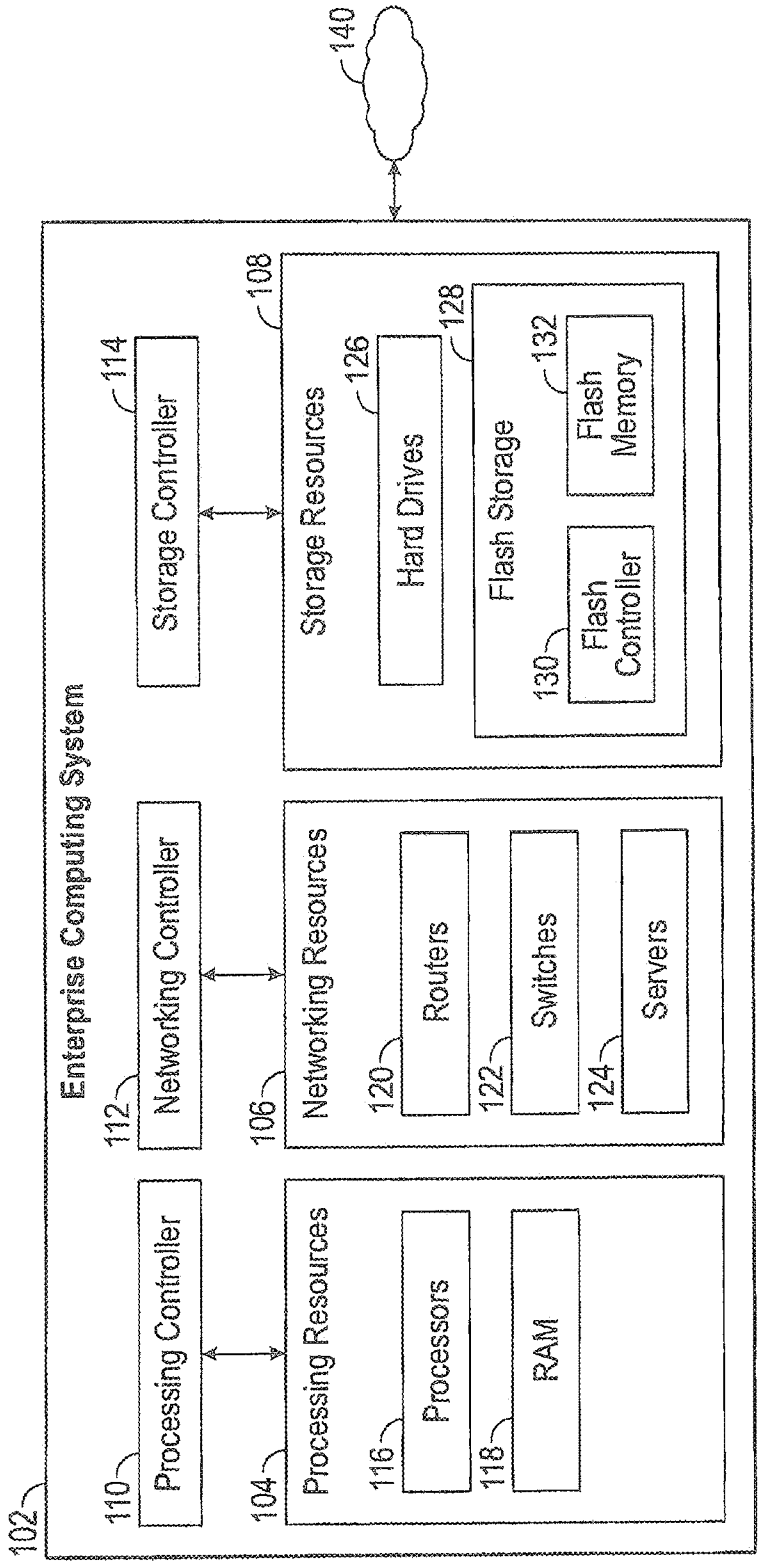
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid-state storage of FIG. 1 as a storage resource 108. For example, flash storage 128 of FIG. 2 may integrate the storage nodes, storage clusters and/or non-volatile solid-state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid-state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid-state storage could be individually configured with a respective amount of storage space, which is then reconfigurable independently of the others. Storage capacity can thus be flexibly added, upgraded, subtracted, recovered and/or reconfigured at each of the non-volatile solid-state storage units. As mentioned previously, each storage node could implement one or more servers in some embodiments.

Figure 3:
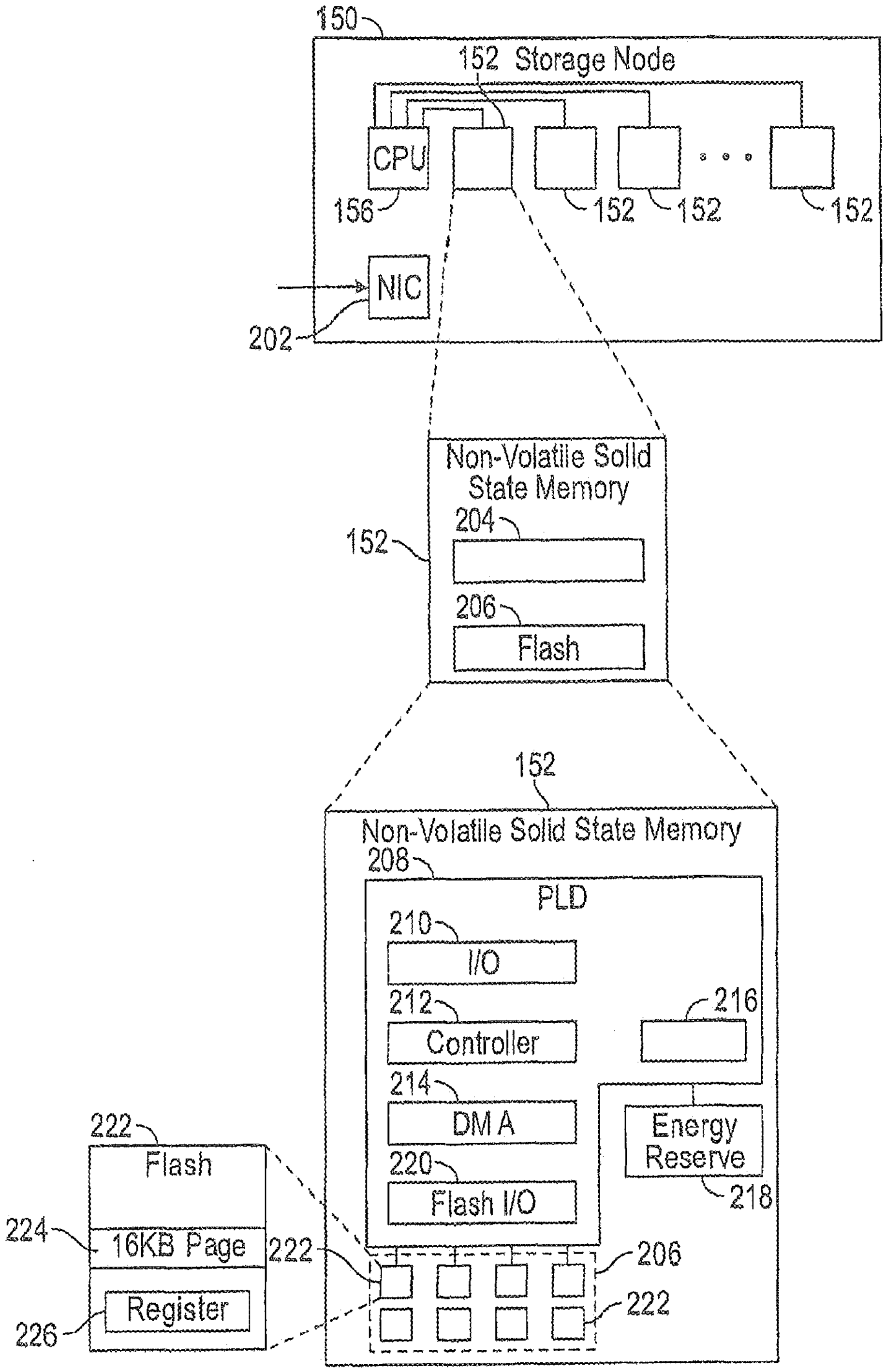
FIG. 3 is a multiple level block diagram, showing contents of a storage node and contents of one of the non-volatile solid-state storage units in accordance with some embodiments.

FIG. 3 is a multiple level block diagram, showing contents of a storage node 150 and contents of a non-volatile solid-state storage unit 152 of the storage node 150. Data is communicated to and from the storage node 150 by a network interface controller (NIC) 202 in some embodiments. Each storage node 150 has a CPU 156, and one or more non-volatile solid-state storage 152, as discussed above. Moving down one level in FIG. 3, each non-volatile solid-state storage unit 152 has a relatively fast non-volatile solid-state memory, such as non-volatile random access memory (NVRAM) 204, and flash memory 206. In some embodiments, NVRAM 204 supports an abundance of program erase cycles. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as dies on a printed circuit board or other substrate. In some embodiments, the hybrid package may include a combination of memory types, such as NVRAM, random access memory (RAM), CPU, field programmable gate array (FPGA), or different sized flash memory in the same package. In the embodiment shown, the non-volatile solid-state storage unit 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

In NVRAM 204, redundancy is not organized by segments but instead by messages, where each message (128 bytes to 128 kB) establishes its own data stripe, in some embodiments. NVRAM is maintained at the same redundancy as segment storage and operates within the same storage node groups in some embodiments. Because messages are stored individually the stripe width is determined both by message size and the storage cluster configuration. Larger messages may be more efficiently stored as wider strips.

With reference to FIGS. 1-3, two of the many tasks of the CPU 156 on a storage node 150 are to break up write data, and reassemble read data. When the system has determined that data is to be written, an authority for that data is located in one of the non-volatile solid-state storage units 152. The authority may be embodied as metadata, including one or more lists such as lists of data segments which the non-volatile solid-state storage unit 152 manages. When a segment ID for data is already determined the request to write is forwarded to the non-volatile solid-state storage unit 152 currently determined to be the host of the authority determined from the segment. The host CPU 156 of the storage node 150, on which the non-volatile solid-state storage unit 152 and corresponding authority reside, then breaks up or shards the data and transmits the data out to various non-volatile solid-state storage 152. The transmitted data is written as a data stripe in accordance with an erasure coding scheme. In some embodiments, data is requested to be pulled, and in other embodiments, data is pushed. In reverse, when data is read, the authority for the segment ID containing the data is located as described above. The host CPU 156 of the storage node 150 on which the non-volatile solid-state storage unit 152 and corresponding authority reside requests the data from the non-volatile solid-state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid-state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Each data segment is protected, e.g., from memory and other failures, by breaking the segment into a number of data and parity shards, where applicable. The data and parity shards are distributed, i.e., striped, across non-volatile solid-state storage units 152 coupled to the host CPUs 156 (See FIG. 3) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top, there is the inode address space, which the filesystem uses to translate file paths to inode IDs (Identifications). Inodes point into medium address space, where data is logically stored. Medium addresses are mapped into segment address space. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid-state storage unit 152 may be assigned a range of address space. Within this assigned range, the non-volatile solid-state storage unit 152 is able to allocate addresses without synchronization with other non-volatile solid-state storage 152.

Data and metadata are stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single non-volatile solid-state storage. Data is not further replicated within a storage cluster, as it is assumed a storage cluster may fail. Reed-Solomon encoding is used within a storage cluster, and mirroring is used within a storage grid in some embodiments. Metadata may be stored using an ordered log structured index (such as a Log Structured Merge Tree), and large data may be stored in an unordered log structured layout (similar to log structured file systems).

Figure 4:
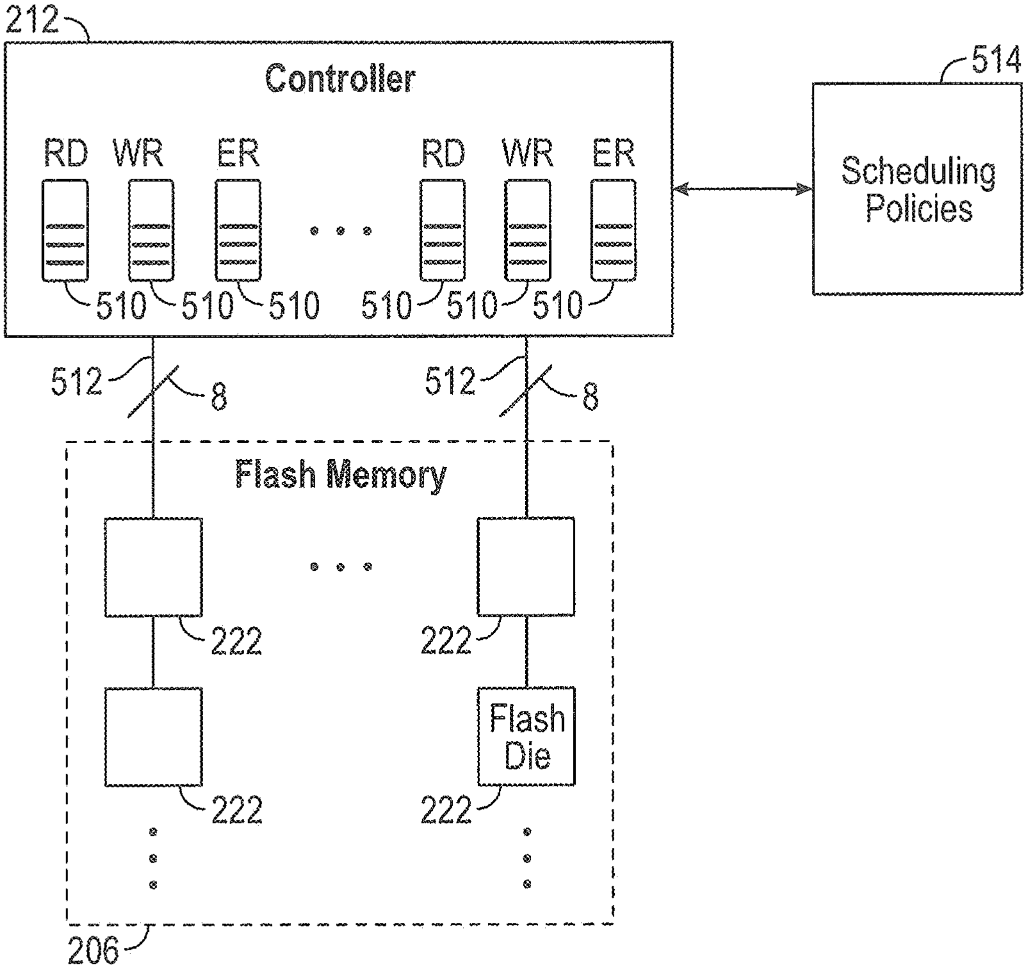
FIG. 4 is a block diagram of a controller with operations queues coupled to flash memory in an embodiment of a non-volatile solid-state storage, operating according to scheduling policies.

FIG. 4 is a block diagram of a controller 212 with operations queues 510 coupled to flash memory 206 in an embodiment of a non-volatile solid-state storage 152, operating according to scheduling policies 514. The scheduling policies 514 are employed by the controller 212 to prioritize operations in the operations queues 510. As described above with reference to FIG. 3, the flash memory 206 has multiple flash dies 222, shown here organized into channels as illustrated by channel 1 and channel n. Each channel has a channel bus 512, which is eight bits wide in the embodiment shown, but could have other widths in further embodiments. Each channel, and channel bus 512, is associated with multiple operations queues 510. Each channel bus 512 thus couples multiple operations queues 510 to 1 or more flash dies 222. The operations queues 510 include read queues, write queues, and erase queues, and may include further queues organized according to traffic classes. These traffic classes could include read operations and write operations relating to user data, metadata, address tables and further system data and operations. In various embodiments, the operations queues 510 are implemented in hardware, firmware, software and memory, or various combinations thereof.

The controller 212 of FIG. 4 receives requests for operations, and places (i.e., deposits or writes) the operations into the operations queues 510. The operations may be sorted according to operations classes, or channels, or both. For example, the controller 212 could receive these requests for operations as messages passed down from the CPU 156 of the storage node 152 to the non-volatile solid-state storage 152. Operations typically include reading data, writing data, or erasing (e.g., a block of flash), although further operations at higher or lower level could be performed. Operations are overlapped for high throughput to and from the flash memory 206 in some embodiments. In order to increase efficiency and prevent conflicts, scheduling policies 514 are adopted. These scheduling policies 514 can be held in a memory in or coupled to the controller 212, and can have various formats as readily devised. In some embodiments, versions of flash memory 206 allow interruptible writes or interruptible erases, which may allow a different set of scheduling policies 514.

Still referring to FIG. 4, the controller 212 evaluates the benefits to the system of operations waiting in the operations queues 510. That is, the controller 212 determines a relative benefit for each of the operations in accordance with the scheduling policies 514. In one embodiment, the controller 212 weights the operations, i.e., assigns a weighting value to each of the operations in the operations queues 510 based on the operation and the scheduling policies 514. In some embodiments, the scheduling, the policies, and/or the weighting can change dynamically each evaluation period or some other time frame. The operations queues 510 may be set up with sufficient memory to have these weights written adjacent to the operations awaiting in the queues 510. Weighting scales with increasing or decreasing values to represent greater benefit, ranges of weighting values, and further mechanisms for evaluating, weighting, or associating weights and operations are readily devised. For each of the channels, i.e., for each of the channel busses 512, the controller 212 selects or determines an operation from the operations queues 510 that has a greater benefit than others of the operations in the operations queues 510. It may be preferable to pick an operation with a maximum benefit, but there also may be operations with equal or approximately equal benefits, and some tie-breaking algorithm could be employed in some embodiments. It may also be expedient to pick an operation with a locally maximum benefit, without examining all of the operations in all of the queues 510, or without finding a globally maximum benefit.

In various embodiments, the controller 212 selects the next operation from the operations queues 510 for each of the channels in various ways. In one embodiment, the controller 212 selects an operation from among operations at the heads of the operations queues 510. In one embodiment, the controller 212 selects an operation from anywhere in the operations queues coupled to each channel. That is, the controller 212 can select operations out of sequence relative to the queues 510. One example policy is a policy to perform the quickest operation or shortest job first, i.e., execute first the operation that consumes the least amount of time. This may be based on expected execution time. For example, a write operation could take from 1 to 3 ms, depending on whether the write is to a fast or a slow page in the flash memory 206. It should be appreciated that various flash memory types, e.g., triple level cell flash (TLC) and quad level cell flash (QLC), can have multiple levels of speed for association with different pages. As a further example, read operations could vary between 100 μs and 500 μs, which may be page dependent. Block erases of flash memory 206 typically take a longer amount of time than either the reads or the writes. An interruptible write, or interruptible erase, could be paused in order to perform a more beneficial write, or a read with a greater benefit value. An erase, even if the erase takes a long time, should be performed at high priority if failing to do so results in running out of storage capacity, i.e., having insufficient storage capacity for new writes.

An aging mechanism is employed in some embodiments, in order to prevent operations from stagnating in the queues 510. For example, without an aging mechanism, an operation having a low system benefit could remain for an undesirably long amount of time in a queue 510. In these embodiments, an aging parameter could be employed that increases in value, i.e., indicates a greater benefit, the longer an operation remains in a queue 510. Each location in each queue 510 could have an aging parameter, such as a timestamp or a value that increments with each evaluation cycle, associated with the operation at that location. The weighting could take the aging parameter into account. In some embodiments, this aging is accounted for in the scheduling policies 514. The data may be explicitly tagged, for example, tags could indicate that an inode number or identifier is being accessed, or a medium address is being accessed. Tags indicating priority could be attached by a file system based on analytics performed in the inode or medium layer. Tags may indicate levels of priority assigned elsewhere in the system in some embodiments. A tag may indicate a client critical path, which should be given a high priority and high relative benefit. In embodiments with such tags, the scheduling policies 514 relate at least in part to the tags. In some embodiments, some or all operations may not be explicitly tagged. In such cases, a determination of relative benefit to the system could be according to the address and/or the content of data associated with the operation. For example, garbage collection may involve read and write operations to move data out of an area so that a block can be reclaimed in flash memory 206. These operations could be given lower weighting than reads or writes of user data requested by a client and in some embodiments the determination of the lower weighting could be based on tags or addresses.

Figure 5:
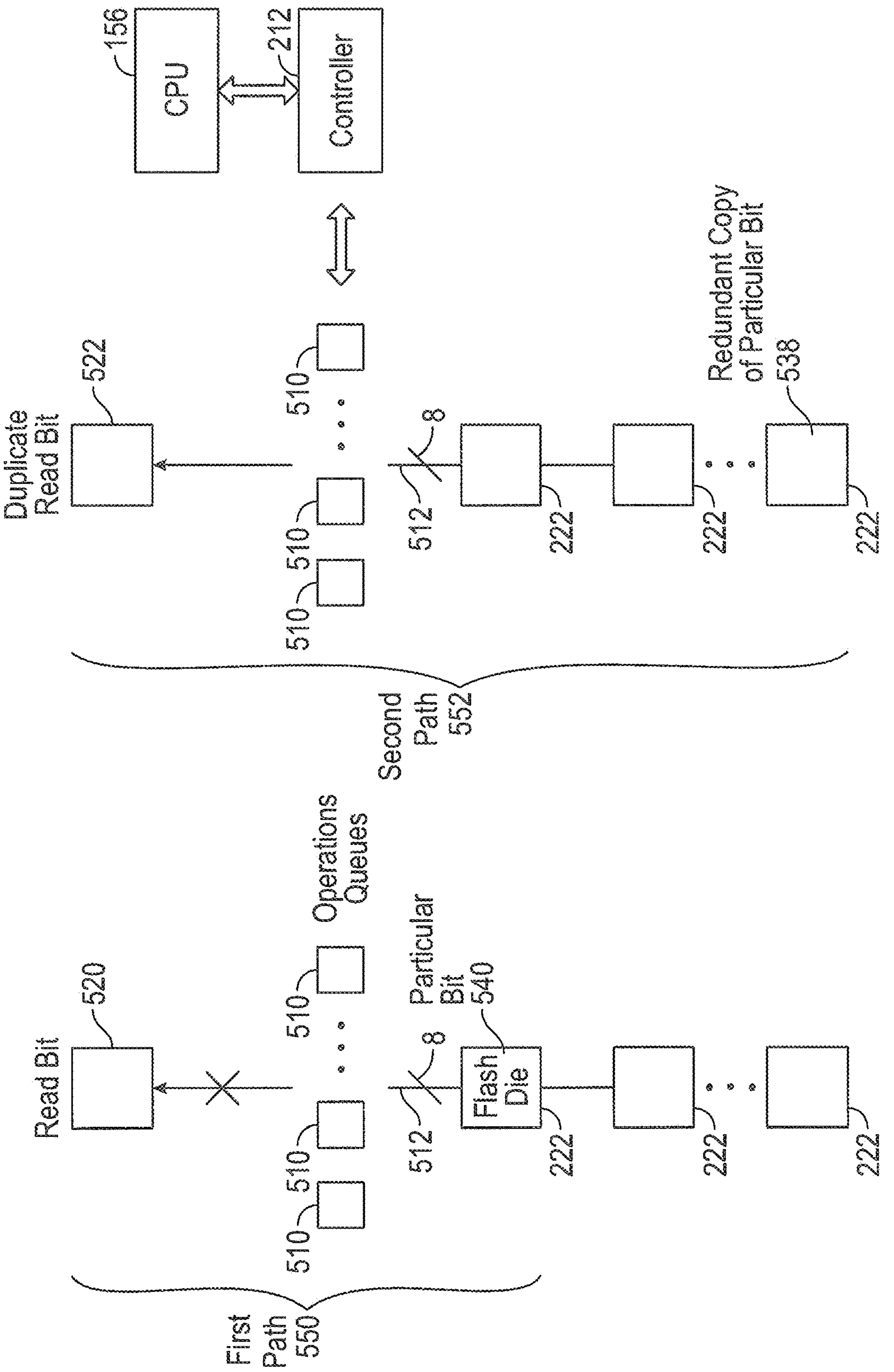
FIG. 5 is a block diagram showing the operations queues of FIG. 4 and various paths for reading bits in flash dies in accordance with some embodiments.

FIG. 5 is a block diagram showing the operations queues 510 of FIG. 4 and various paths for reading bits in flash dies 222. The operations queues 510 provide feedback to the controller 212 of the non-volatile solid-state storage 152. The controller 212 can then use this feedback to manage the operations queues 510 according to the policies as described above (see FIG. 4), and the controller 212 can pass some or all of this feedback, or calculations or analysis based on this feedback, to the CPU 156 of the storage node 150 (see FIG. 3). Feedback from the operations queues 510 could include information regarding remaining capacity or fullness of each of the operations queues 510, weighting of operations presently in the operations queues 510, priorities of operations presently in the operations queues 510, quantities of operations presently in the operations queues 510, or the contents of the operations queues 510. Further types of feedback, and formats or representations of the feedback, are readily devised in accordance with the teachings herein. The CPU 156 of the storage node 150 can use the information from the operations queues 510 to make decisions as to whether or not to do a rebuild of data in some embodiments. This could be based on a performance target for data reads, e.g., a targeted read latency, which can be expressed as a latency budget. If, for a read of a particular bit 540 in a flash die 222, the latency budget is exceeded, i.e., it would take too long a time to perform that read, the CPU 156 can decide to rebuild the data. The read operation may be for a single bit, more than one bit, a byte, a word, a page, a block, etc., in some embodiments. Every component along a particular path adds some delay, and the total of these delays impacts the performance budget. The CPU 156 can perform analysis of various paths, and determine which path to apply in order to meet a latency budget in some embodiments. The path of information flow from the operations queues 510 up to the CPU 156 enables this path analysis.

In the scenario depicted in FIG. 5, the CPU 156 is attempting to read, via the controller 212, a particular bit 540 in a flash die 222. This could be in order to obtain a read bit 520 which is part of a data segment, or the read bit 520 could be part of some metadata. In this scenario, a redundant copy 538 of the particular bit 540 exists in another flash die 222. This could be the case when erasure coding is applying redundancy to user data, or when redundancy is applied to metadata. Generally, a first path 550 to a particular bit 540 on a flash die 222 includes a particular channel bus 512, and a particular subset of the operations queues 510. Other paths generally include different channel busses 512, different subsets of the operations queues 510, and different flash dies 222. Controller 212 or the CPU 156 determines, from the feedback from the operations queues 510, that reading the particular bit 540 from the flash die 222 along the first path 550 will take longer than a specified latency budget which may be expressed in microseconds or milliseconds in some embodiments. The latency may be due to the operations queues 510 have too many high priority operations (or operations with high weight) present in the operations queues 510 associated with the particular channel bus 512 along the first path 550. Too many operations could be scheduled ahead of a requested operation under consideration. A write queue could be in danger of overflowing and need service or a block erase could be scheduled at high priority, to avoid loss of write capacity, and so on. In such cases, it will take too much time until the read of the particular bit 540 in the flash die 222 can be performed. Such a situation is depicted as an "X" along the first path 550, indicating that the first path 550 will not satisfy the latency budget. The CPU 156 determines to obtain a duplicate read bit 522 via a second path 552, which leads to a redundant copy of the particular bit 538. In some embodiments the parity bit can be used to rebuild the page to lead to the redundant copy. The second path 552 bypasses the first path 550, and thus avoids the delays indicated by the feedback from the operations queues 510 along the first path 550. In making such a determination, the CPU 156 compares estimated delays along the first path 550 and the second path 552, and chooses the faster path. Determining whether a read of a bit in the non-volatile solid-state memory is likely to be within a latency budget can be a task of the controller 212, the CPU 156, or both as a shared task. Once the decision is made, the read is performed along the preferred path. A storage cluster 160 can thus perform a read of user data or metadata via the second path 552, as a result of determining that reading the particular bit 540 via the first path 550 is not likely to be within the latency budget.

Figure 6:
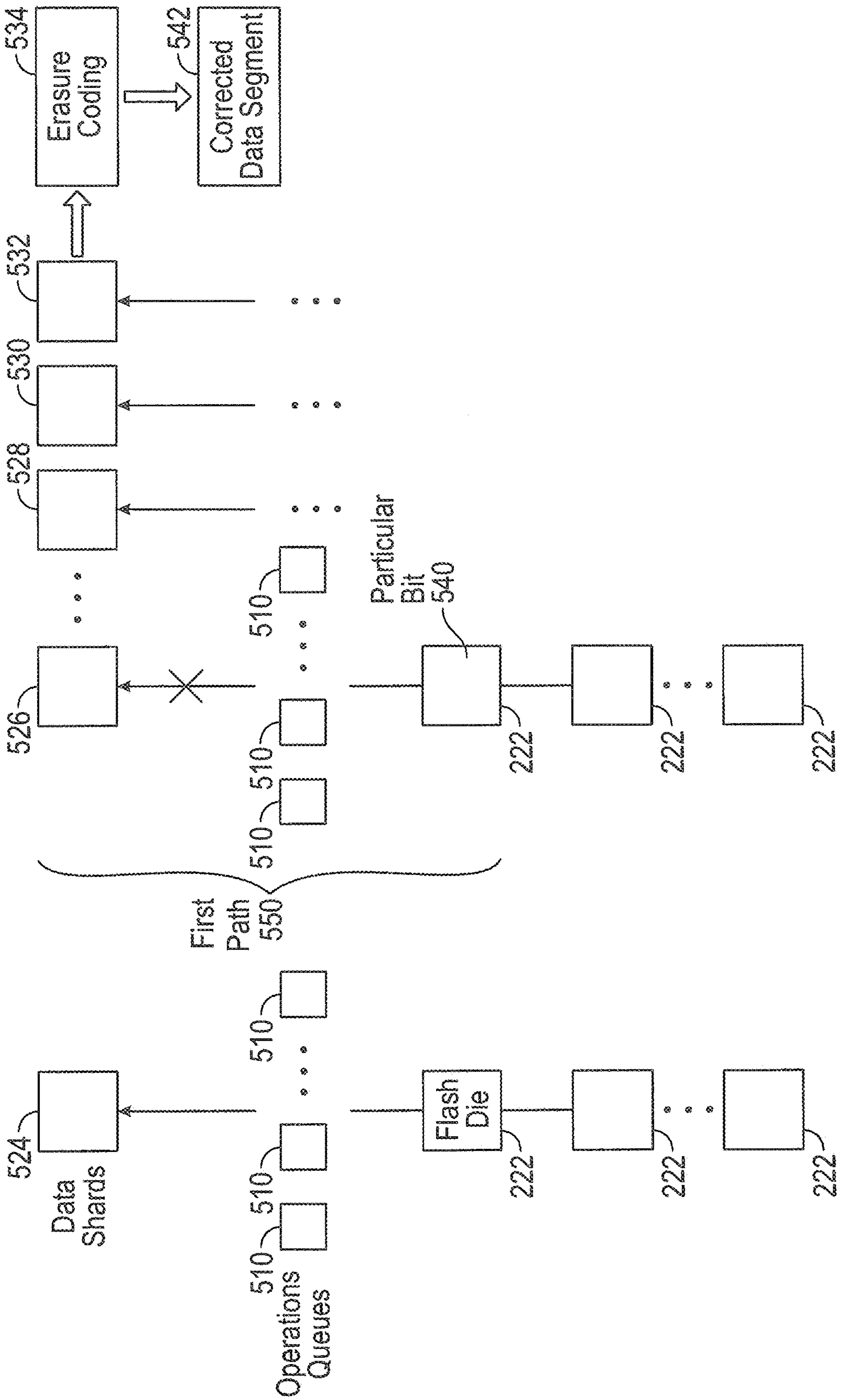
FIG. 6 is a block diagram showing the operations queues of FIG. 4 and further paths for reading bits in flash dies in accordance with some embodiments.

FIG. 6 is a block diagram showing the operations queues 510 of FIG. 4 and further paths for reading bits in flash dies 222. In one scenario applicable to FIG. 6, the CPU 156 of a storage node 150 is attempting to read user data, specifically a data segment. For this, the CPU 156 is attempting to gather the data shards 524, 526, 528, 530, 532 from respective solid-state storages 152. Similarly to the scenario depicted in FIG. 5, the controller 212 and/or the CPU 156 determines that reading the particular bit 540 in the flash die 222 via the first path 550 is likely to exceed the latency budget. This is again depicted as the "X" along the first path 550. So, in this scenario, the data shard 526 will not be available within the latency budget. The CPU 156 determines to apply erasure coding 534 to the remaining data shards 524, 528, 530, 532, without waiting for the data shard 526. Applying the erasure coding 534 to the remaining data shards 524, 528, 530, 532 produces the corrected data segment 542 without incurring the latency penalty that would have applied from the wait for the data shard 526. This constitutes a differing version of a second path, which bypasses the first path 550, and results in a rebuild of the user data. A storage cluster 160 can thus perform a read of user data via this second path, as a result of determining that reading the particular bit 540 via the first path 550 is not likely to be within the latency budget.

In some cases, this rebuilding of the user data, e.g., producing a corrected data segment 542, reconstructs the missing or overly delayed data shard 526. This could occur when the data shard 526 represents a specified bit in the corrected data segment 542, which is reconstructed using the erasure coding 534. However, in other cases, the rebuilding of the user data produces the corrected data segment 542 from data shards 524, 528, 530, 532 which represent error correction code bits and specified bits in the corrected data segment 542, with the missing or overly delayed data shard 526 representing one of the error correction code bits. The missing or overly delayed data shard 526 is not necessarily directly reconstructed, and the erasure coding scheme has sufficient coverage to rebuild the corrected data segment 542 despite lacking one of the error correction code bits.

It should be appreciated that the above scenarios and operations described relative to operations queues 510 and various paths can be applied to other types of non-volatile solid-state storage. Differing paths, various versions of feedback from the operations queues 510, various types of erasure coding, levels of redundancy, and calculations or determinations performed by a controller 212 and/or a CPU 156 at various levels in a storage cluster 160 are applicable to the various embodiments.

Figure 7:
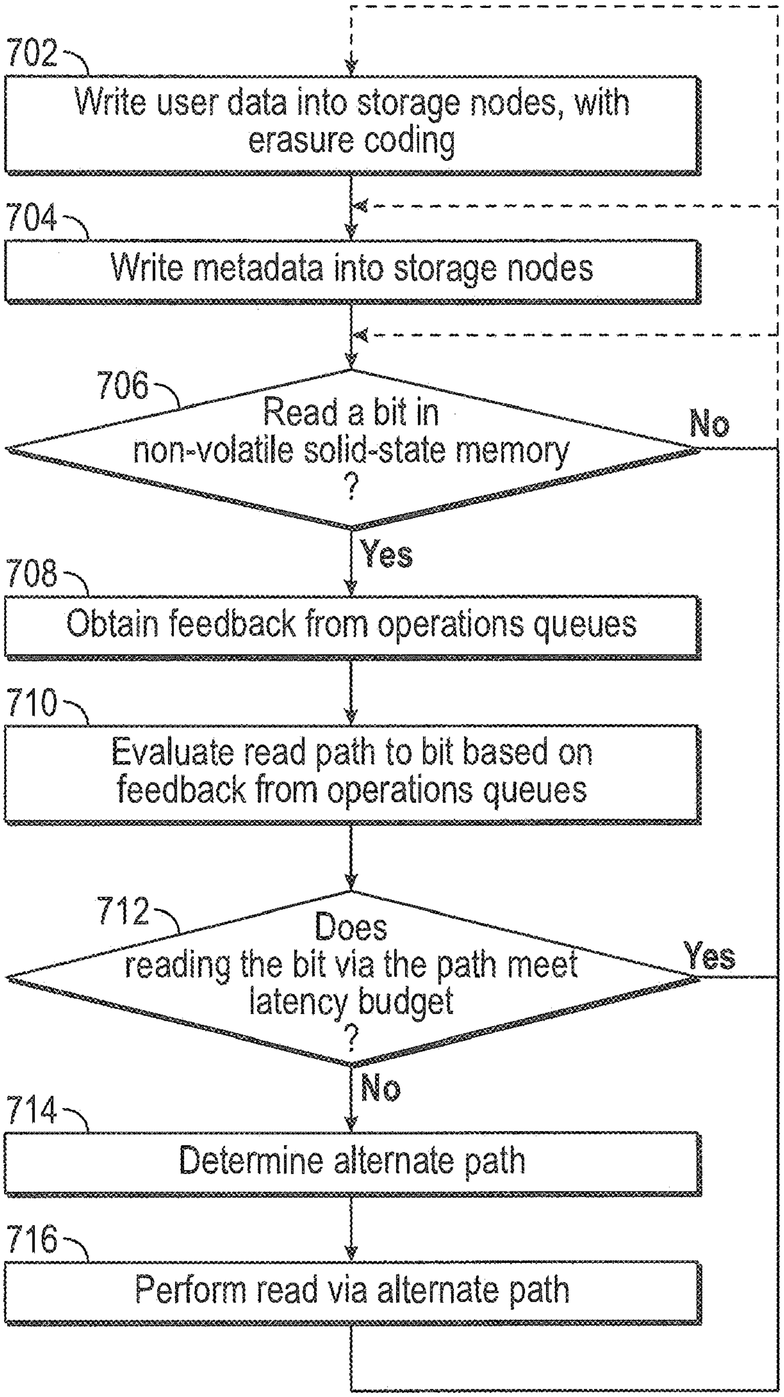
FIG. 7 is a flow diagram of a method for accessing data in a storage cluster in accordance with some embodiments.

FIG. 7 is a flow diagram of a method for accessing data in a storage cluster, which can be practiced on or by various storage clusters, storage nodes and/or non-volatile solid-state storage units in accordance with some embodiments. In an action 702, user data is written into storage nodes of a storage cluster, with erasure coding. The erasure coding could include redundant copies of user data and/or error correction code applied to the user data. In various embodiments, the storage nodes include non-volatile solid-state storage units with non-volatile solid-state memory. Some embodiments include flash memory. The erasure coding is such that the user data is accessible via the erasure coding, even when two of the storage nodes are determined to be unreachable. In an action 704, metadata is written into the storage nodes. In various embodiments, metadata is written into non-volatile random-access memory, solid-state memory and/or flash memory. One or more redundant copies of metadata may be written into the memory.

In a decision action 706, it is determined if the storage cluster should read a bit in a non-volatile solid-state memory. This could be based on a received request, such as a request to read user data, or a request to read metadata. The request directs, at least in part, to read the bit in the non-volatile solid-state memory. This could be as part of a process of reading data shards to assemble a data segment, or part of reading a subset of the metadata. If the answer is no, flow branches back to one of the actions 702, 704, 706, in order to write more user data or metadata into the storage nodes, or determine whether there should be a read of a bit. If the answer is yes, flow continues to the action 708, to evaluate the read path. In the action 708, feedback is obtained from operations queues. As described above, operations queues are coupled to the channel bus along a path of interest to a particular read bit in solid-state memory. The read path to the bit in the non-volatile solid-state memory is evaluated based on the feedback from the operations queues, in an action 710.

In a decision action 712, it is determined if the reading of the bit via the path meets the latency budget. The latency budget may be predefined based on performance goals for the system. If the answer is yes, reading the bit via the path meets the latency budget, flow continues back to one of the actions 702, 704, 706, to write more user data or metadata, or determine whether there should be a read of a bit. If the answer is no, the latency budget is not met, flow continues to the action 714. In action 714, an alternate path is determined. For example, a controller or a processor could determine that an alternate path to a redundant copy of a data bit or metadata bit is available, or erasure coding could be applied to produce a corrected data segment. In an action 716, a read is performed via the alternate path. For example, the redundant copy of the data bit or the redundant copy of the metadata bit could be read by the alternate path. In some embodiments, a read of data shards could be performed via the alternate path, followed by erasure coding application, to produce a corrected data segment. Following this read, flow branches back to one of the actions 702, 704, 706, to write more user data or metadata, or determine whether there should be a read of a bit.

Figure 8:
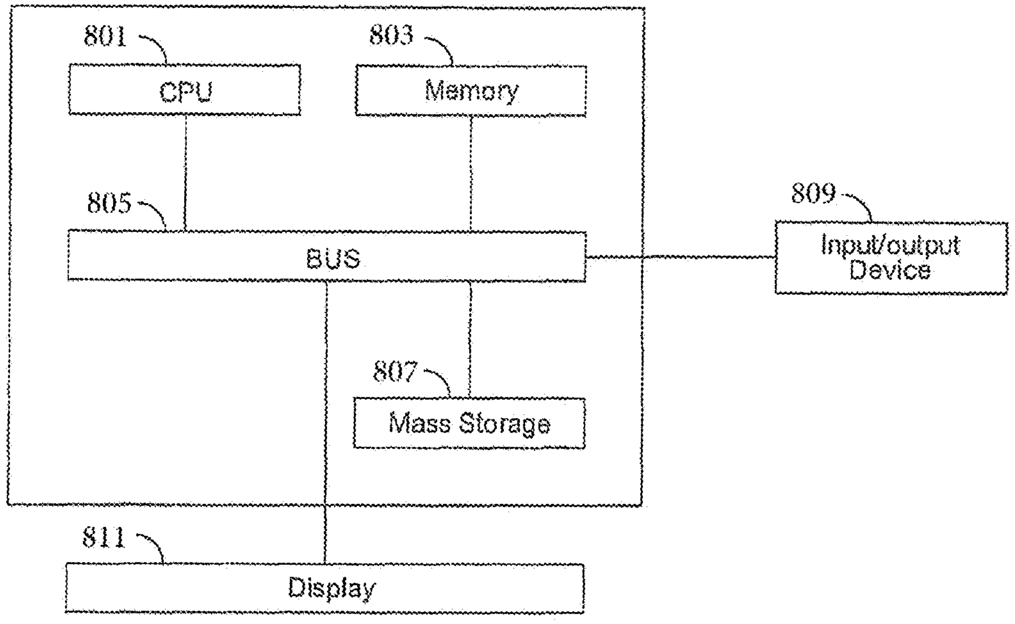
FIG. 8 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 8 is an illustration showing an exemplary computing device which may implement the embodiments described herein. The computing device of FIG. 8 may be used to perform embodiments of the functionality for a storage node or a non-volatile solid-state storage in accordance with some embodiments. The computing device includes a central processing unit (CPU) 801, which is coupled through a bus 805 to a memory 803, and mass storage device 807. Mass storage device 807 represents a persistent data storage device such as a disc drive, which may be local or remote in some embodiments. The mass storage device 807 could implement a backup storage, in some embodiments. Memory 803 may include read only memory, random access memory, etc. Applications resident on the computing device may be stored on or accessed via a computer readable medium such as memory 803 or mass storage device 807 in some embodiments. Applications may also be in the form of modulated electronic signals modulated accessed via a network modem or other network interface of the computing device. It should be appreciated that CPU 801 may be embodied in a general-purpose processor, a special purpose processor, or a specially programmed logic device in some embodiments.

Display 811 is in communication with CPU 801, memory 803, and mass storage device 807, through bus 805. Display 811 is configured to display any visualization tools or reports associated with the system described herein. Input/output device 809 is coupled to bus 805 in order to communicate information in command selections to CPU 801. It should be appreciated that data to and from external devices may be communicated through the input/output device 809. CPU 801 can be defined to execute the functionality described herein to enable the functionality described with reference to FIGS. 1-7. The code embodying this functionality may be stored within memory 803 or mass storage device 807 for execution by a processor such as CPU 801 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

Advantages and features of the present disclosure can be further described by the following statements:

1. A method, comprising:
 receiving a request to read data from a storage system;
 determining whether a storage operation should be delayed, based on the request to read the data from the storage system;
 in response to determining that the storage operation should be delayed, delaying the storage operation; and
 performing a read operation for the request to read the data.

2. The method of claim 1, wherein determining whether the storage operation should be delayed comprises:
 determining whether delaying the storage operation exceeds a latency limit for the storage operation.

3. The method of claim 1, wherein determining whether the storage operation should be delayed comprises:
 determining a priority of the read operation;
 determining whether the storage operation should be delayed based on the priority of the read operation.

4. The method of claim 1, wherein the storage operation has a higher latency than the read operation.

5. The method of claim 1, wherein delaying the storage operation comprises:
 issuing an interrupt to pause the storage operation.

6. The method of claim 1, further comprising:
 in response to determining that the storage operation should not be delayed, allowing the storage operation to proceed.

7. The method of claim 1, wherein the storage operation comprises a write operation.

8. A storage system, comprising:
 a plurality of non-volatile memory units; and
 a processor operatively coupled to a plurality of non-volatile memory units, to perform a method, comprising:
 receiving a request to read data from the storage system;
 determining whether a storage operation should be delayed, based on the request to read the data from the storage system;
 in response to determining that the storage operation should be delayed, delaying the storage operation; and
 performing a read operation for the request to read the data.

9. The storage system of claim 8, wherein determining whether the storage operation should be delayed comprises:
 determining whether delaying the storage operation exceeds a latency limit for the storage operation.

10. The storage system of claim 8, wherein determining whether the storage operation should be delayed comprises:

determining a priority of the read operation;

determining whether the storage operation should be delayed based on the priority of the read operation.

11. The storage system of claim 8, wherein the storage operation has a higher latency than the read operation.

12. The storage system of claim 8, wherein delaying the storage operation comprises: issuing an interrupt to pause the storage operation.

13. The storage system of claim 8, wherein the method further comprises:

in response to determining that the storage operation should not be delayed, allowing the storage operation to proceed.

14. The storage system of claim 8, wherein the storage operation comprises a write operation.

15. A non-transitory, computer-readable media having instructions thereupon which, when executed by a processor, cause the processor to perform a method comprising:

receiving a request to read data from a storage system;

determining whether a storage operation should be delayed, based on the request to read the data from the storage system;

in response to determining that the storage operation should be delayed, delaying the storage operation; and performing a read operation for the request to read the data.

16. The non-transitory, computer-readable media of claim 15, wherein determining whether the storage operation should be delayed comprises:

determining whether delaying the storage operation exceeds a latency limit for the storage operation.

17. The non-transitory, computer-readable media of claim 15, wherein determining whether the storage operation should be delayed comprises:

determining a priority of the read operation;

determining whether the storage operation should be delayed based on the priority of the read operation.

18. The non-transitory, computer-readable media of claim 15, wherein the storage operation has a higher latency than the read operation.

19. The non-transitory, computer-readable media of claim 15, wherein the method further comprises:

in response to determining that the storage operation should not be delayed, allowing the storage operation to proceed.

20. The non-transitory, computer-readable media of claim 15, wherein the storage operation comprises a write operation.

What is claimed is:

1. A method, comprising:

receiving a request to read data from a storage system;

pausing, by a processing device of a storage system controller, one of an interruptible write operation or an interruptible erase operation being performed on flash memory of the storage system;

performing a read operation for the request to read the data, including determining whether reading the data via a first path satisfies a latency condition and, in response to the latency condition not being satisfied, reading the data via an alternative path; and resuming the one of the interruptible write operation or interruptible erase operation.

2. The method of claim 1, further comprising:

determining whether pausing the one of the interruptible write operation or the interruptible erase operation exceeds a latency limit.

3. The method of claim 1, further comprising:

determining a priority of the read operation; and pausing the one of the interruptible write operation or the interruptible erase operation based on the priority of the read operation.

4. The method of claim 1, further comprising:

determining whether the request to read the data from the storage system has a lower latency than the one of the interruptible write operation or the interruptible erase operation; and in response to determining that the request to read the data has the lower latency, pausing the one of the interruptible write operation or the interruptible erase operation.

5. The method of claim 1, wherein the storage system comprises one or more managed flash storage devices that offload management responsibilities to the storage system controller.

6. The method of claim 1, wherein pausing the one of the interruptible write operation or the interruptible erase operation comprises issuing an interrupt to a storage device performing the one of the interruptible write operation or the interruptible erase operation.

7. The method of claim 1, wherein the storage system comprises differing types of flash memory.

8. A storage system, comprising:

a plurality of storage devices comprising flash memory; and a storage system controller comprising a processing device configured to:

receive a request to read data from a storage system;

pause one of an interruptible write operation or an interruptible erase operation being performed on the flash memory of the storage system;

perform a read operation for the request to read the data, including determining whether reading the data via a first path satisfies a latency condition and, in response to the latency condition not being satisfied, reading the data via an alternative path; and resume the one of the interruptible write operation or interruptible erase operation.

9. The storage system of claim 8, wherein the processing device is further configured to:

determine whether pausing the one of the interruptible write operation or the interruptible erase operation exceeds a latency limit.

10. The storage system of claim 8, wherein the processing device is further configured to:

determine a priority of the read operation; and pause the one of the interruptible write operation or the interruptible erase operation based on the priority of the read operation.

11. The storage system of claim 8, wherein the processing device is further configured to:

determine whether the request to read the data from the storage system has a lower latency than the one of the interruptible write operation or the interruptible erase operation; and in response to determining that the request to read the data has the lower latency, pause the one of the interruptible write operation or the interruptible erase operation.

12. The storage system of claim 8, wherein the plurality of storage devices comprises one or more managed flash storage devices that offload management responsibilities to the storage system controller.

13. The storage system of claim 8, wherein pausing the one of the interruptible write operation or the interruptible erase operation comprises issuing an interrupt to a storage device performing the one of the interruptible write operation or the interruptible erase operation.

14. The storage system of claim 8, wherein the storage system comprises differing types of flash memory.

15. A non-transitory computer readable storage medium storing instructions which, when executed, cause a processing device of a storage system controller to:

receive a request to read data from a storage system;

pause one of an interruptible write operation or an interruptible erase operation being performed on flash memory of the storage system;

perform a read operation for the request to read the data, including determining whether reading the data via a first path satisfies a latency condition and, in response to the latency condition not being satisfied, reading the data via an alternative path; and resume the one of the interruptible write operation or interruptible erase operation.

16. The non-transitory computer readable storage medium of claim 15, wherein the processing device is further to:

determine whether pausing the one of the interruptible write operation or the interruptible erase operation exceeds a latency limit.

17. The non-transitory computer readable storage medium of claim 15, wherein the processing device is further to:

determine a priority of the read operation; and pause the one of the interruptible write operation or the interruptible erase operation based on the priority of the read operation.

18. The non-transitory computer readable storage medium of claim 15, wherein the processing device is further to:

determine whether the request to read the data from the storage system has a lower latency than the one of the interruptible write operation or the interruptible erase operation; and in response to determining that the request to read the data has the lower latency, pause the one of the interruptible write operation or the interruptible erase operation.

19. The non-transitory computer readable storage medium of claim 15, wherein the storage system comprises one or more managed flash storage devices that offload management responsibilities to the storage system controller.

20. The non-transitory computer readable storage medium of claim 15, wherein pausing the one of the interruptible write operation or the interruptible erase operation comprises issuing an interrupt to a storage device performing the one of the interruptible write operation or the interruptible erase operation.

* * * * *